United States Patent
Sandhu

[19]

[11] Patent Number: 6,043,450
[45] Date of Patent: Mar. 28, 2000

[54] METHOD TO COMPENSATE FOR NON-UNIFORM FILM GROWTH DURING CHEMICAL VAPOR DEPOSITION

[75] Inventor: Gurtej S. Sandhu, Boise, Id.

[73] Assignee: Micron Technology, Inc., Boise, Id.

[21] Appl. No.: 09/075,101

[22] Filed: May 8, 1998

Related U.S. Application Data

[63] Continuation of application No. 08/605,369, Feb. 22, 1996, Pat. No. 5,751,896.

[51] Int. Cl.[7] ............................... H05B 1/02; H01L 21/20
[52] U.S. Cl. ............................... 219/121.43; 219/121.41; 219/502; 392/416; 118/50.1; 250/494.1; 250/492.2
[58] Field of Search ............................... 219/502, 121.4, 219/494, 497; 392/416, 411; 250/492.2, 493.1, 494.1; 118/724, 725, 50.1

[56] References Cited

U.S. PATENT DOCUMENTS

| | | |
|---|---|---|
| 3,836,751 | 9/1974 | Anderson . |
| 4,543,472 | 9/1985 | Arai et al. . |
| 4,680,451 | 7/1987 | Gat et al. . |
| 4,842,686 | 6/1989 | Davis et al. . |
| 5,073,698 | 12/1991 | Stultz ..................................... 219/405 |
| 5,108,792 | 4/1992 | Anderson et al. . |
| 5,138,973 | 8/1992 | Davis et al. . |
| 5,155,337 | 10/1992 | Sorrell .................................... 219/413 |
| 5,179,677 | 1/1993 | Anderson et al. . |
| 5,336,641 | 8/1994 | Fair et al. . |
| 5,393,564 | 2/1995 | Westmoreland et al. . |
| 5,399,379 | 3/1995 | Sandhu . |
| 5,444,217 | 8/1995 | Moore et al. . |
| 5,446,825 | 8/1995 | Moslehi et al. . |
| 5,493,987 | 2/1996 | McDiarmid et al. . |
| 5,504,831 | 4/1996 | Sandhu et al. . |
| 5,650,630 | 7/1997 | Dierks et al. ......................... 250/492.1 |
| 5,751,896 | 5/1998 | Sandhu .................................... 392/416 |

FOREIGN PATENT DOCUMENTS

| | | |
|---|---|---|
| 63-110735 | 5/1988 | Japan . |
| 1-238116 | 9/1989 | Japan . |
| 3-25928 | 2/1991 | Japan . |
| 8-107078 | 4/1996 | Japan . |
| 8-124923 | 5/1996 | Japan . |
| 9103915 | 3/1991 | WIPO . |

*Primary Examiner*—Mark Paschall
*Attorney, Agent, or Firm*—Kirkpatrick & Lockhart LLP

[57] ABSTRACT

An apparatus for heating, according to a predetermined heating profile, a surface carrying a film. The invention includes a source of radiant energy. The source of radiant energy has several peak wavelengths, with each peak wavelength having a unique absorption profile related to the thickness of the film. The source of radiant energy is positioned to direct radiant energy toward the surface. Means are included for holding the source of radiant energy in a manner such that the combination of peak wavelengths produce the desired predetermined heating profile.

9 Claims, 10 Drawing Sheets

METHOD TO COMPENSATE FOR NON-UNIFORM FILM GROWTH DURING CHEMICAL VAPOR DEPOSITION

CROSS-REFERENCE TO RELATED APPLICATIONS

This application is a continuation of U.S. patent application Ser. No. 08/605,369, filed on Feb. 22, 1996, now U.S. Pat. No. 5,751,896.

BACKGROUND OF THE INVENTION

1. Field of the Invention

The present invention is directed generally to methods and apparatus used for growing films, and in particular, methods and apparatus using chemical vapor deposition techniques in a rapid thermal processing system for growing films.

2. Description of the Background

In the fabrication of semi-conductor devices, the deposition of a film on a surface of the wafer is a common and necessary step. The film is typically a semi-conductor, a conductor, or a dielectric. It is well known in the prior art that film deposition occurs more readily on a hot surface than on a cold surface. As a result, it is necessary to heat the surface of the wafer to induce film deposition. Wafers are typically heated and processed either by conventional batch furnace processing or by rapid thermal processing ("RTP").

RTP is an alternative to conventional batch furnace processing and is characterized by short processing times and rapid thermal rise and fall rates. An RTP process step typically lasts between several seconds and 15 minutes, with thermal rise rates typically between 100 and 500° C. per second, and reaching temperatures of 1200° C.

RTP has applications in the fabrication of very large scale integrated ("VLSI") circuits and ultra large scale integrated ("ULSI") circuits. In particular, RTP is used in the fabrication steps of thermal oxidation, thermal nitridation, dopant diffusion, thermal annealing, refractory metal silicide formation, and chemical vapor deposition ("CVD"). CVD may be used to form semi-conductive, conductive, and dielectric films. The design of RTP reactors is well known in the prior art, as disclosed, for example, in U.S. Pat. No. 5,446,825, issued to Moslehi et al., and U.S. Pat. No. 5,444,217, issued to Moore et al. An RTP reactor typically comprises a reaction chamber, a wafer handling system, a gas dispersion apparatus, a heat source, a temperature control system, and a gas control system.

The heat source is often high power lamps which drive chemical reactions in the reaction chamber and heat the wafer, thereby inducing film deposition on the surface of the wafer. The use of both single and multiple lamps is known, as disclosed in U.S. Pat. No. 5,444,217, issued to Moore et al. The gas dispersion apparatus introduces gases into the reaction chamber so that chemical reactions can take place and films can be deposited on the surface of the wafer. Many types of gas dispersion apparatus are known, and one or more may be located below the wafer, to the side of the wafer, or above the wafer.

CVD process steps are dependent on temperature. Because film is more readily deposited on hot surfaces than on cold surfaces, if the surface of a wafer is not a uniform temperature, a film will not be deposited uniformly. The temperature of a wafer, in turn, is dependent on the thickness of previously-deposited films. The absorption of energy, which is directly related to the temperature of the wafer, increases with the thickness of previously-deposited films.

It is well known, however, that the temperature of a wafer is not uniform. In particular, the temperature at the edge of a wafer tends to be significantly cooler than the temperature at the center, due to heat loss at the wafer edge. The lower temperature at the edge of the wafer results in slower deposition and a thinner film. That thinner film results in less absorption of energy, and a lower temperature than in the center of the wafer, perpetuating a feedback loop which exaggerates the non-uniformity of the wafer. The thickness of polysilicon, for example, can vary as much as 40% because of non-uniform temperatures along the surface of a wafer.

Uneven heating of wafers is undesirable and can cause slip dislocations, which are fractures in the crystal lattice that may lead to a device failure. Furthermore, an uneven surface can cause defects in subsequent process steps.

One type of gas dispersion apparatus used for CVD process steps is known as a "showerhead". Showerheads are located above the wafer, have a generally flat bottom surface with a plurality of gas ports therein, and provide for a generally uniform distribution of gas over the surface of the wafer. Showerheads are made from transparent materials which do not absorb much light, such as quartz.

Some solutions to the problems caused by non-uniform temperature of a wafer have been proposed. For example, U.S. Pat. No. 5,446,852, issued to Moslehi et al., discloses surrounding the wafer with a light absorbing graphite or silicon ring to reduce wafer edge cooling. This solution, however, is not satisfactory, particularly in CVD processes in an RTP chamber where there is sensitivity to temperature variations of less than 5° C. Other solutions include the use of independently controlled light banks, using complex temperature sensors and complex computer software to constantly adjust the lamp banks in an attempt to provide uniform heating of a wafer. That approach is also deficient in extreme temperature sensitive applications, as well as being very costly. Thus, a need exists for a device which effectively provides uniform heating of the surface of a wafer.

SUMMARY OF THE INVENTION

The present invention is directed to an apparatus for heating, according to a predetermined heating profile, a surface carrying a film. The invention includes a source of radiant energy. The source of radiant energy has several peak wavelengths, with each peak wavelength having a unique absorption profile related to the thickness of the film. The source of radiant energy is positioned to direct radiant energy toward the surface. Means are included for holding the source of radiant energy in a manner such that the combination of peak wavelengths produce the desired predetermined heating profile.

The device of the present invention is preferably embodied in a semi-conductor processing apparatus, such as an RTP system. The apparatus comprises a reaction chamber and a wafer support means located within the chamber and capable of supporting a wafer. A showerhead, having a gas passageway for receiving a source of gas and terminating in a several gas ports, is located within the chamber. The invention includes a source of radiant energy. The source of radiant energy has several different peak wavelengths, with each peak wavelength having a unique absorption profile related to the thickness of the film. The energy source is positioned to direct radiant energy toward the wafer support means. Means are provided for holding the source of radiant energy in a manner such that the combination of peak wavelengths produce the desired predetermined heating profile. A window separates the source of radiant energy from the wafer support means. A gas removal system is integrally connected to the chamber and removes gases from within the chamber. A computer controls the sources of radiant energy and the gas removal system.

The present invention solves the problem of non-uniform film growth by providing even heating of a wafer, independent of film thickness and without requiring complex and expensive monitoring and control devices. Those and other advantages and benefits of the present invention will become apparent from the description of the preferred embodiments hereinbelow.

BRIEF DESCRIPTION OF THE DRAWINGS

For the present invention to be clearly understood and readily practiced, the present invention will be described in conjunction with the following figures, wherein.

It is to be understood that the figures have been simplified to illustrate only those aspects relevant for a clear understanding of the present invention, while eliminating, for the purposes of clarity, many other elements. Those of ordinary skill in the art will recognize that other elements are required, or at least desirable, to produce the illustrated devices. However, because such elements are well-known in the art, and because they do not relate to the design which is the subject of the present invention, a discussion of such elements is not provided herein.

DESCRIPTION OF THE PREFERRED EMBODIMENTS

Figure 1:
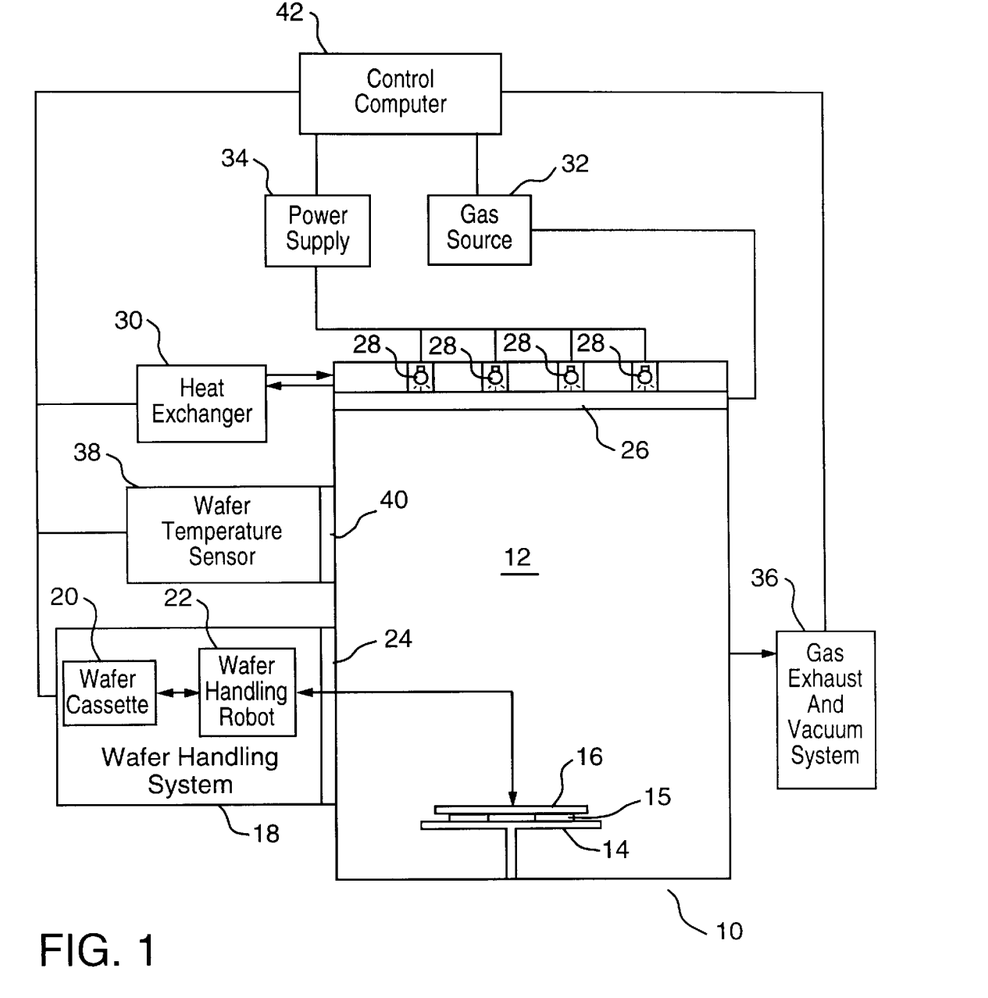
FIG. 1 is a simplified schematic block diagram of an RTP reactor constructed according to the present invention.

FIG. 1 shows a simplified schematic block diagram illustrating a preferred embodiment of the present invention in the context of an RTP reactor 10. The design and construction of RTP reactors is well known, and will not be discussed in detail herein. The RTP reactor is presented as the preferred embodiment of the present invention, but it is to be understood that the invention is not limited to RTP reactors. The RTP reactor 10 of the present invention preferably comprises a cold wall reaction chamber 12 constructed of stainless steel. The bottom and sides of the reaction chamber 12 may be lined with quartz to protect the walls from film deposition during the processing steps. The walls of the reaction chamber 12 may be cooled by a circulating water jacket (not shown) in conjunction with a heat exchanger (not shown). The walls are maintained at or below 100° C., because higher temperatures may induce the deposition of films on the walls of the reaction chamber 12. Such depositions are undesirable because they absorb energy and effect heat distribution within the reaction chamber 12, causing temperature gradients which adversely affect the processing steps. Furthermore, depositions on walls may flake and produce particulates that can contaminate a wafer in the reaction chamber 12.

A wafer support table 14 or the like is located near the bottom of the reaction chamber 12, and is used for supporting a wafer 16. The support table 14 is a flat surface, typically having three or more vertical support pins 15 with low thermal mass.

A wafer handling system 18 is adjacent to the reaction chamber 12, and includes a wafer cassette 20 and a wafer handling robot 22. The wafer cassette 20 holds a plurality of wafers, and the wafer handling robot 22 transports one wafer at a time from the wafer cassette 20 to the wafer support table 14, and back again. A door 24 isolates the wafer handling system 18 from the reaction chamber 12 when the wafers are not being transported to and from the wafer support table 14.

Figure 9:
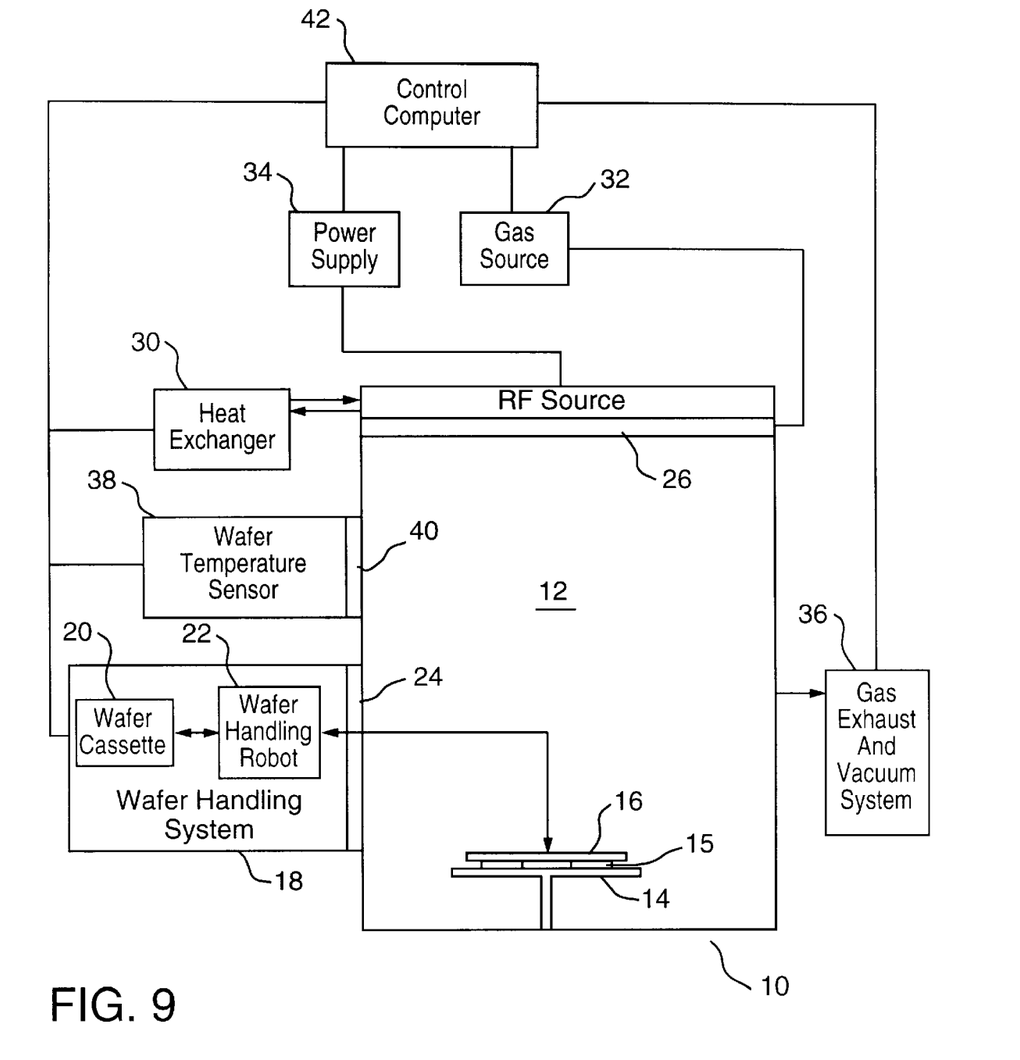
FIG. 9 is a simplified schematic block diagram of an RTP reactor utilizing an RF energy source and constructed according to the present invention.
Figure 10:
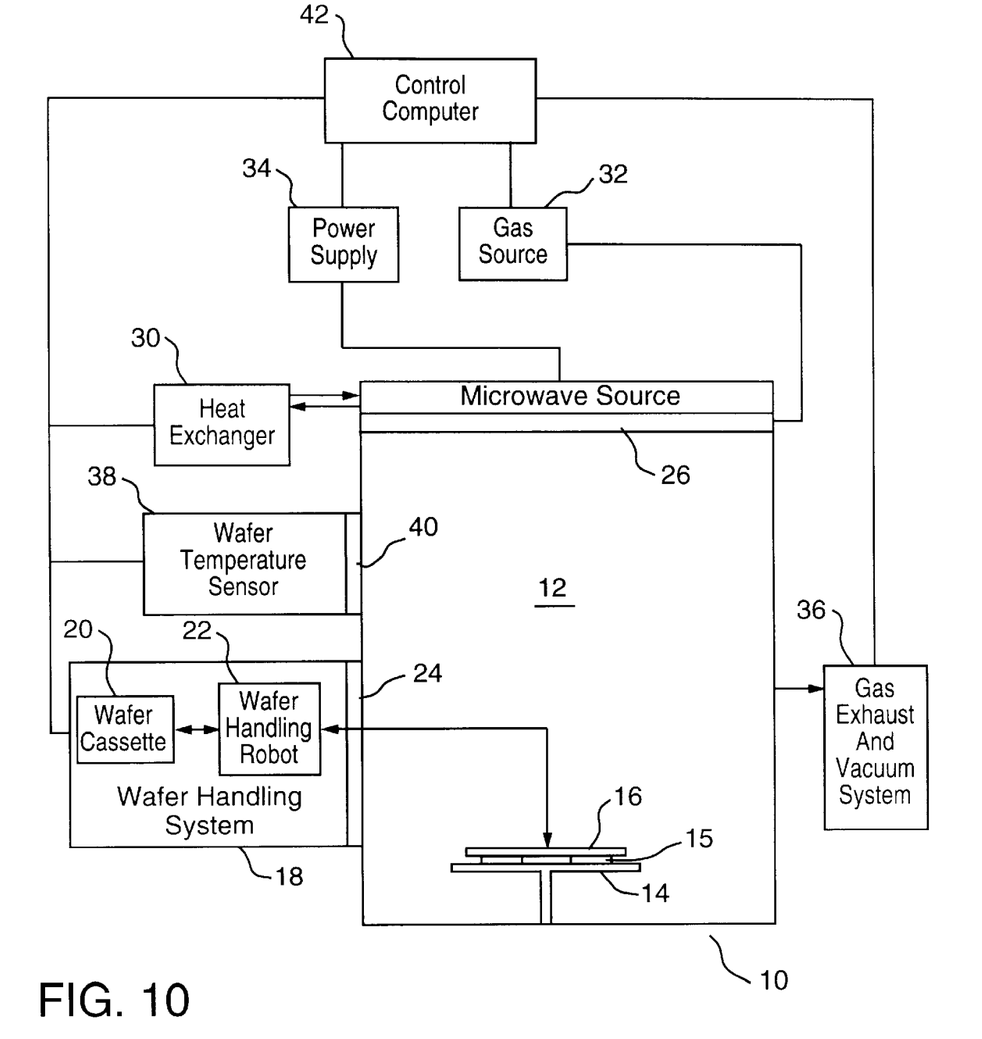
FIG. 10 is a simplified schematic block diagram of an RTP reactor utilizing a microwave energy source and constructed according to the present invention.

A showerhead 26 introduces gases into the reaction chamber 12, and a plurality of light sources 28 provide a source of radiant heat energy and heat the wafer 16. For the purposes of this description, the invention will be described in terms of light sources 28, although other sources of heating a wafer 16, such as RF energy as illustrated in FIG. 9 and microwave energy, as illustrated in FIG. 10, are known and applicable to the present invention.

The showerhead 26 and light sources 28 are preferably integrated into the roof of the reaction chamber 12. The showerhead 26, of course, may be suspended from the roof and the light sources 28 located behind a transparent window, as is done with showerheads in the prior art. Integrating the showerhead 26 and the light sources 28 into the roof, however, makes it easier to cool the light sources 28 and eliminates the need to cool or heavily insulate wires supplying electricity to the light sources 28. The light sources 28 are cooled by one or more known cooling methods, such as liquid or gaseous cooling systems, with heat being dissipated through a heat exchanger 30.

A source of gas 32 is connected to the showerhead 26 to provide the gases to the showerhead 26. More than one type of gas may be available from the source of gas 32, and gases may be provided to the showerhead 26 individually or in combination. The gases may, for example, be used to deposit films on the wafer 16, flush gases from the reaction chamber 12, or cool the reaction chamber 12 and the wafer 16. A power supply 34 is connected to the light sources 28 to provide electricity to power the light sources 28.

Gases are removed from the reaction chamber 12, and a vacuum may be created within the reaction chamber 12, by a gas exhaust and vacuum system 3.6, as is well known in the prior art.

Also present is a wafer temperature sensor 38, such as a pyrometer, which is used to measure the temperature of the wafer 16 through a window 40.

A control computer 42 monitors and controls the various systems which make up the reactor 10, such as the wafer handling robot 22, the heat exchanger 30, and the wafer temperature sensor 38. Data indicating the temperature of the wafer 16 is generated by the wafer temperature sensor 38, and is used by the control computer 42 to adjust the intensity of the light sources 28 so as to produce the desired wafer temperature. In addition, multiple wafer temperature sensors 38 may be used to sense the temperature of different regions of the wafer 16. That data may be used by the control computer 42 to selectively adjust the intensity of some of the light sources 28 so as to compensate for uneven heating of the wafer 16. The control computer 42 also controls when and what gases are provided to the showerhead 26, as well as when gases are removed from the reaction chamber 12, in a known manner.

The showerhead 26 includes a gas passageway 50 which connects the source of gas 32 with a plurality of gas output ports 52 on the lower surface 48 of the showerhead 26. The gas ports 52 may be shaped and distributed in any manner which promotes the uniform distribution of gas, such as concentric circles and rectangular patterns. The showerhead 26 typically contains between 50 and 1,000 gas ports 52, with the size of each port preferably being between 0.5 millimeters and 50 millimeters. The gas flow through the showerhead 26 is typically between 100 and 5,000 standard cubic centimeters per minute ("sccm").

The light sources 28 are preferably quartz-halogen lamps, each rated between 500 and 2000 Watts. There are preferably between 10 and 500 light sources 28.

Alternatively, the showerhead 26 and light sources 28 may be constructed as completely separate pieces, with the showerhead 26 hanging from the top of the reaction chamber 12 and the light source 28 located outside of the reaction chamber 12 and providing light through a window in the reaction chamber 12 and through the transparent showerhead 26, as is well known in the prior art.

Figure 2:
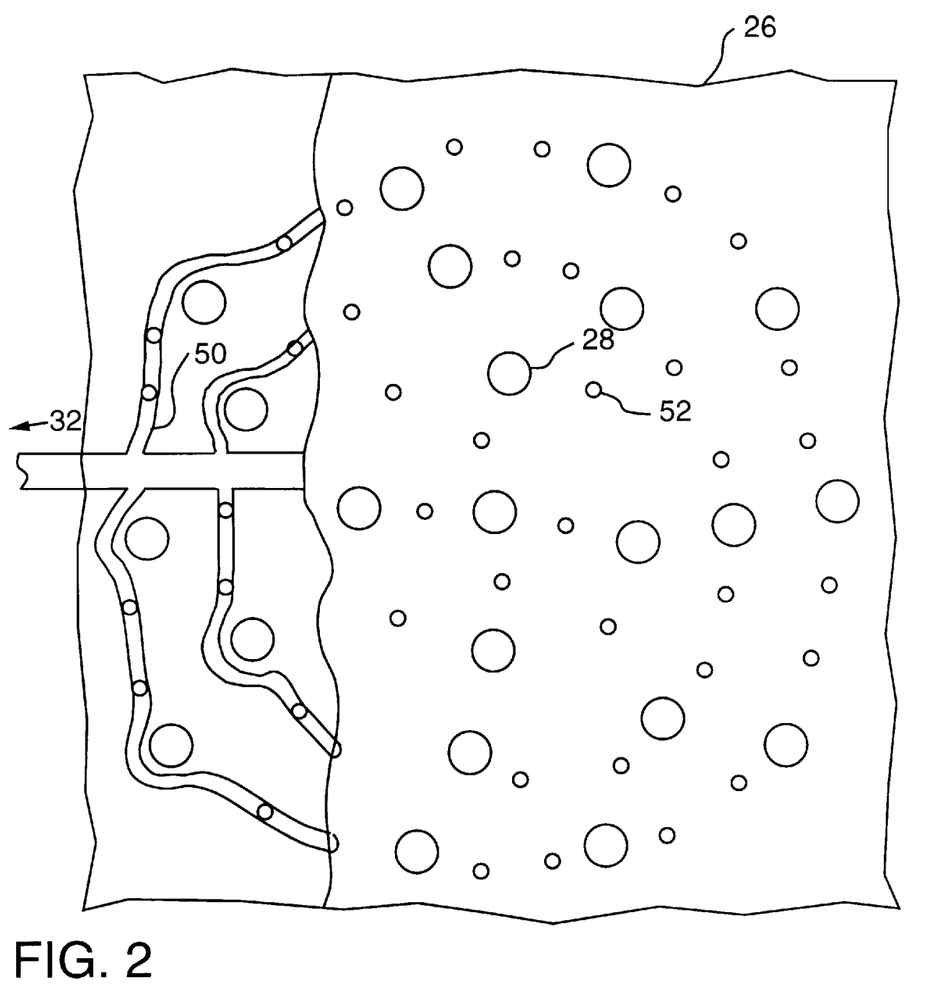
FIG. 2 is a partially cut-away bottom plan view of a showerhead constructed according to the present invention.
Figure 11:
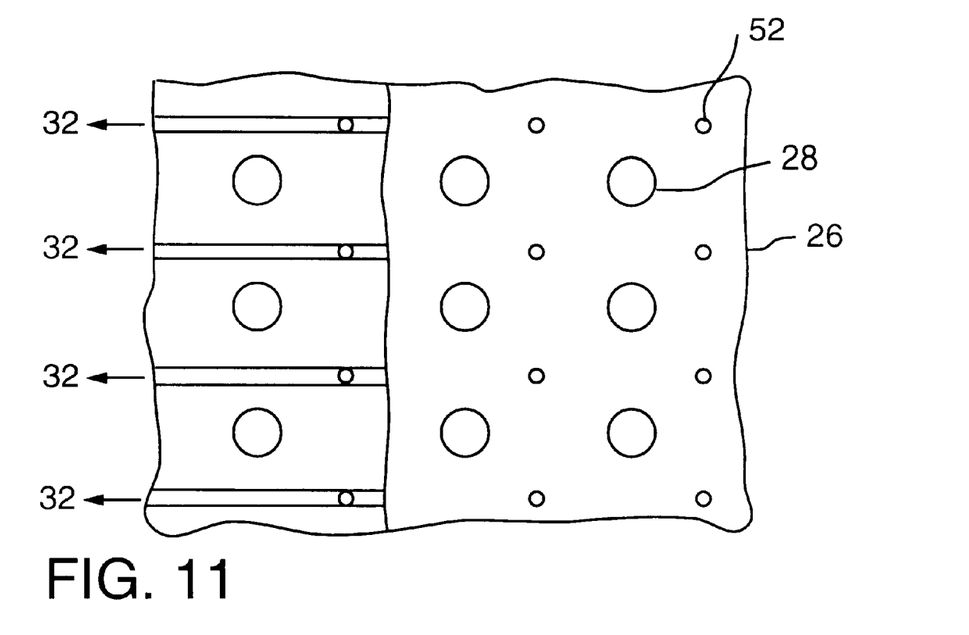
FIG. 11 is a partially cut-away bottom plan view of a showerhead having lamps arranged in a rectangular pattern and constructed according to the present invention.
Figure 12:
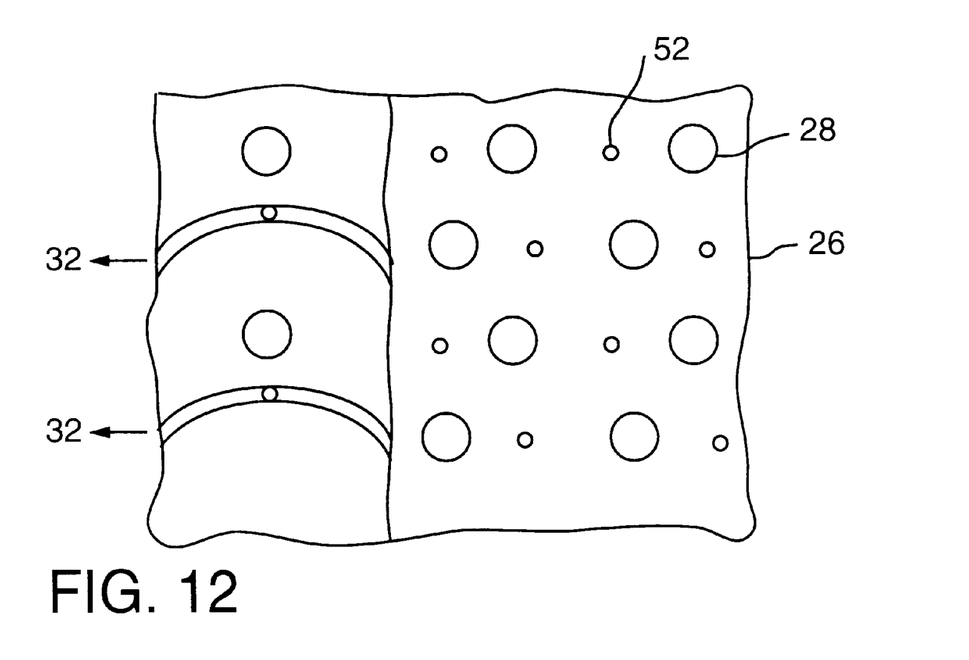
FIG. 12 is a partially cut-away bottom plan view of a showerhead having lamps arranged in a honeycomb pattern and constructed according to the present invention.

FIG. 2 shows a partially cut-away bottom plan view of a preferred embodiment of the showerhead 26. The showerhead 26 has light sources 28 visible through the transparent showerhead 26, and gas ports 52 on the showerhead 26. A gas passageway 50 is visible where the showerhead 26 is cut away. The gas passageway 50 receives gas from a source of gas 32 (shown in FIG. 1), and delivers the gas to the gas ports 52. Both the light sources 28 and gas ports 52 are shown in a concentric pattern. Other patterns which provide for a substantially uniform distribution of light and gas, such as rectangular, as illustrated in FIG. 11, and honeycomb, as illustrated in FIG. 12, are also desirable.

Figure 3:
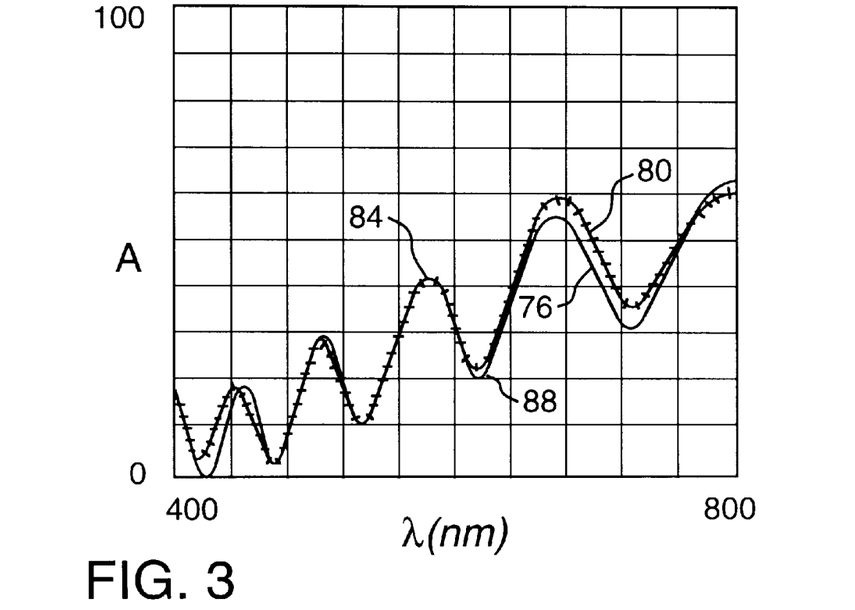
FIGS. 3 and 4 are plots of absorptivity versus energy wavelength for an oxide on metal stack.
Figure 4:
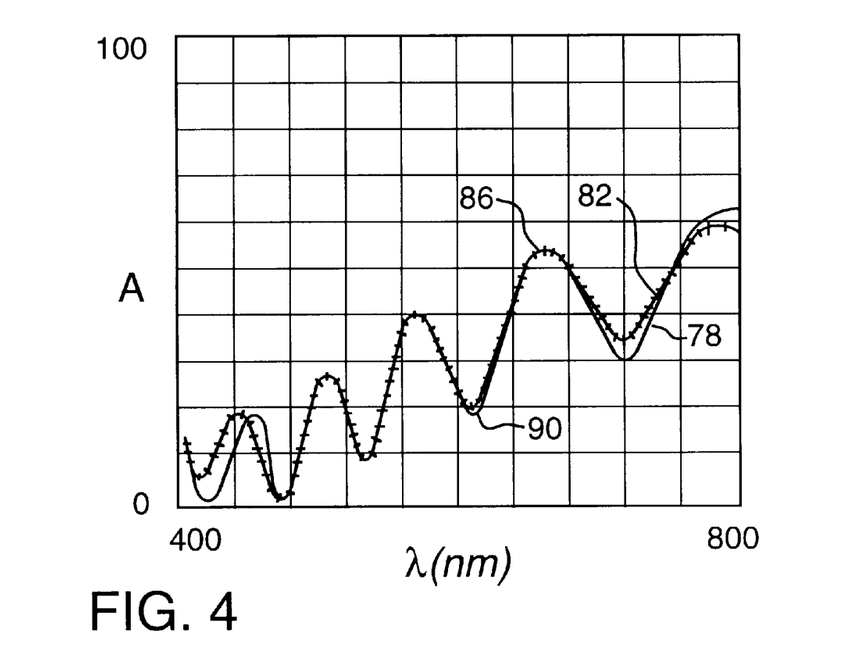

FIGS. 3 and 4 shows theoretical and experimental values for absorptivity by an oxide on metal stack in an atmosphere of air, plotted for wavelengths between 400 and 800 nanometers. FIG. 3 shows values for a center portion of a wafer with an oxide layer 1.350 microns thick. FIG. 4, in contrast, shows values for an edge portion of a wafer with an oxide layer 1.315 microns thick. The theoretical curves 76 and 78 in FIGS. 3 and 4 are shown as solid lines, and the experimental curves 80 and 82 are shown as hashed lines. All curves are comprised of a series of peaks 84 (FIG. 3) and 86 (FIG. 4), and valleys 88 (FIG. 3) and 90 (FIG. 4). As a result of the thinner oxide layer at the edge portion of the wafer (FIG. 4), the peaks 86 and valleys 90 in FIG. 4 are slightly lower than the peaks 84 and valleys 88 in FIG. 3. FIGS. 3 and 4 also show that the absorptivity varies significantly, as the wavelength of light varies.

Figure 5:
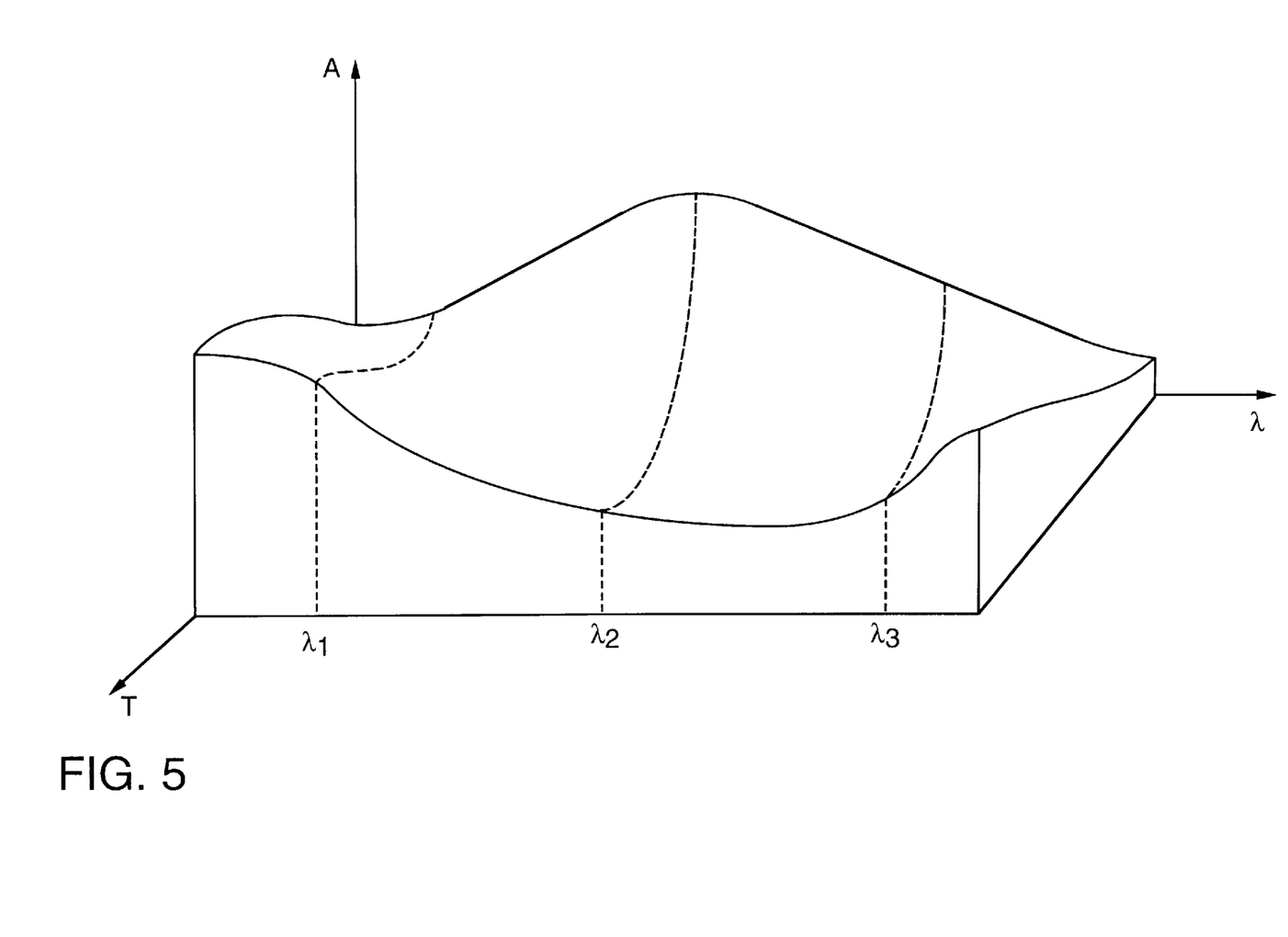
FIG. 5 is a three dimensional plot of absorptivity, energy wavelength, and film thickness.

FIG. 5 shows a three-dimensional plot of wavelength $\lambda$, absorptivity A, and film thickness T. By slicing the three-dimensional plot perpendicular to the axis of the wavelength $\lambda$, a plot of absorptivity A versus thickness T can be obtained. FIG. 5 shows three slices of the plot, shown in dashed lines, for wavelengths $\lambda_1$, $\lambda_2$, and $\lambda_3$. The plots of absorptivity A versus thickness T for wavelengths $\lambda_1$ and $\lambda_2$ are significantly different. For example, at a thickness value where $\lambda_1$ has a peak, $\lambda_2$ has a valley. As a result of those differences, by carefully choosing two or more wavelengths, a composite plot of absorptivity A versus thickness T can be created.

Figure 6:
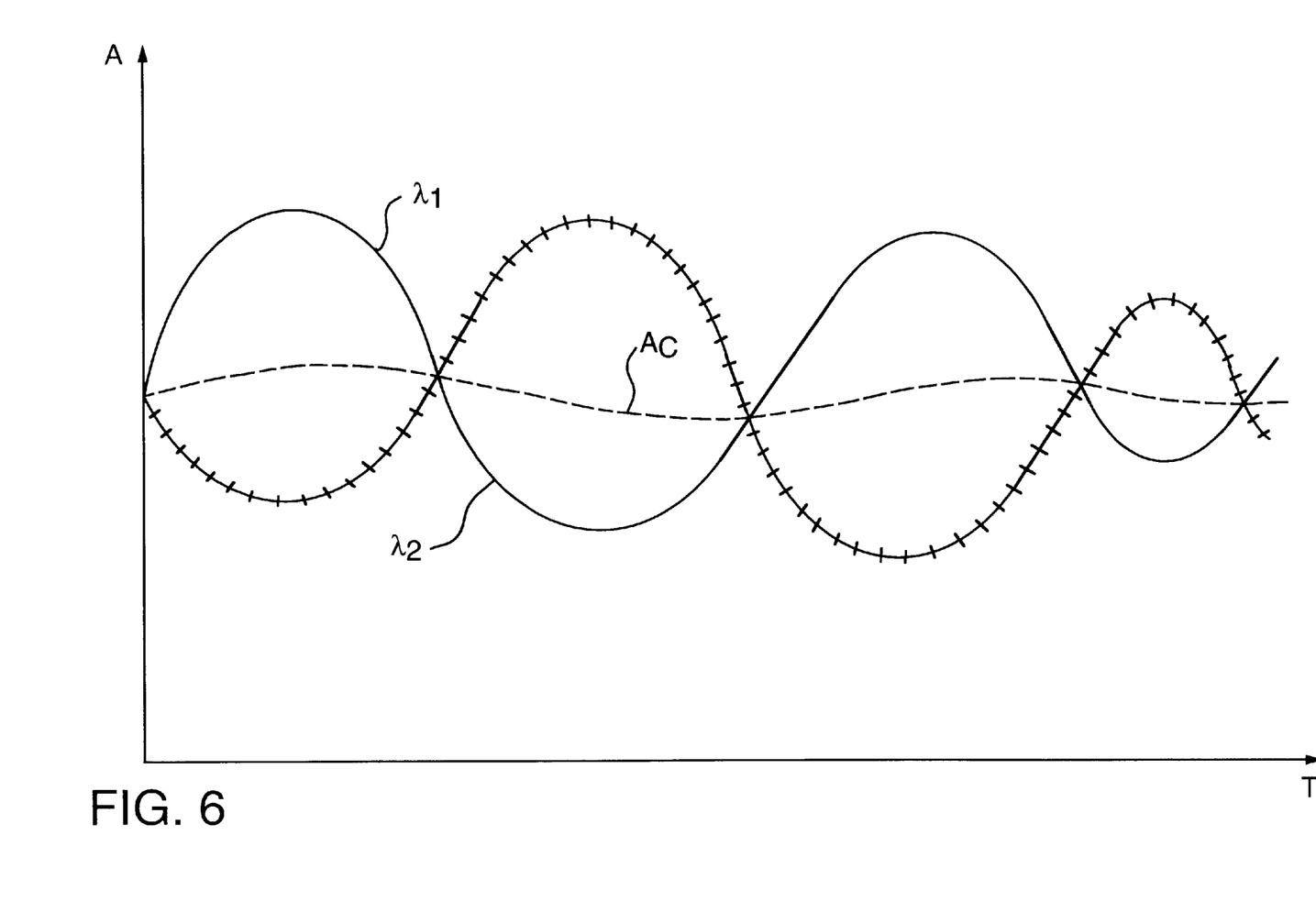
FIG. 6 is a plot of absorptivity versus film thickness for two different wavelengths of energy and a resultant composite of the wavelengths.

FIG. 6 shows a plot of absorptivity A versus thickness T for two wavelengths $\lambda_1$ and $\lambda_2$ having absorptivity peaks and valleys, respectively, at similar thickness values, with similar magnitudes, but with opposite polarity. A composite absorptivity curve $A_c$ can be created which has a substantially constant value for all values of thickness.

A substantially flat absorptivity curve will compensate for non-uniform film growth on a wafer, and breaks the feedback cycle that exaggerates the non-uniformity of film thickness. For example, a flat absorptivity curve will deposit a uniform film, even if a non-uniform film exists on the wafer.

Preferably either two or three different wavelengths are combined to create the desired absorptivity curve. Additional wavelengths may be used, however, to eliminate minor fluctuations in the curve, or to tailor the curve to specific requirements. For example, a curve in which absorptivity decreases as thickness increases may be used to create a more even film thickness by prompting faster growth in areas of thin film, and slower growth in areas of thick film. When the film thickness is approximately uniform, the film will be deposited at approximately the same rate.

Figure 7:
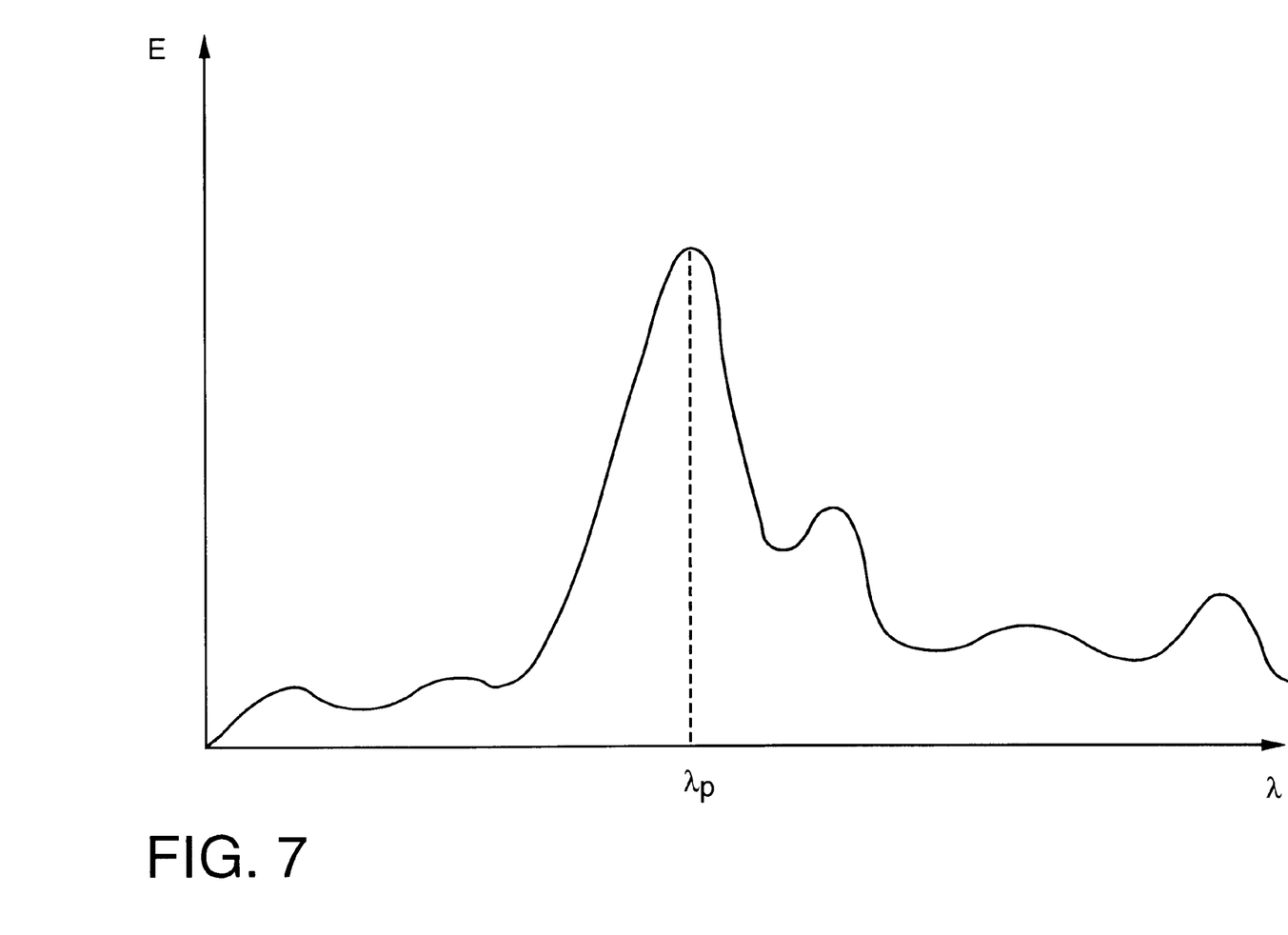
FIG. 7 is a plot of intensity versus energy wavelength for a light source.

FIG. 7 shows a plot of light energy (intensity) I versus wavelength $\lambda$. As shown in FIG. 7, light sources typically generate light over a wide range of wavelengths. Some light sources 28, however, have one or more "peak" wavelengths $\lambda_p$ which are substantially greater in magnitude than any other wavelength generated by the light source 28. As a result, the desired combination of wavelengths, such as those illustrated in FIG. 7, may be created by choosing an appropriate combination of light sources 28.

Figure 8:
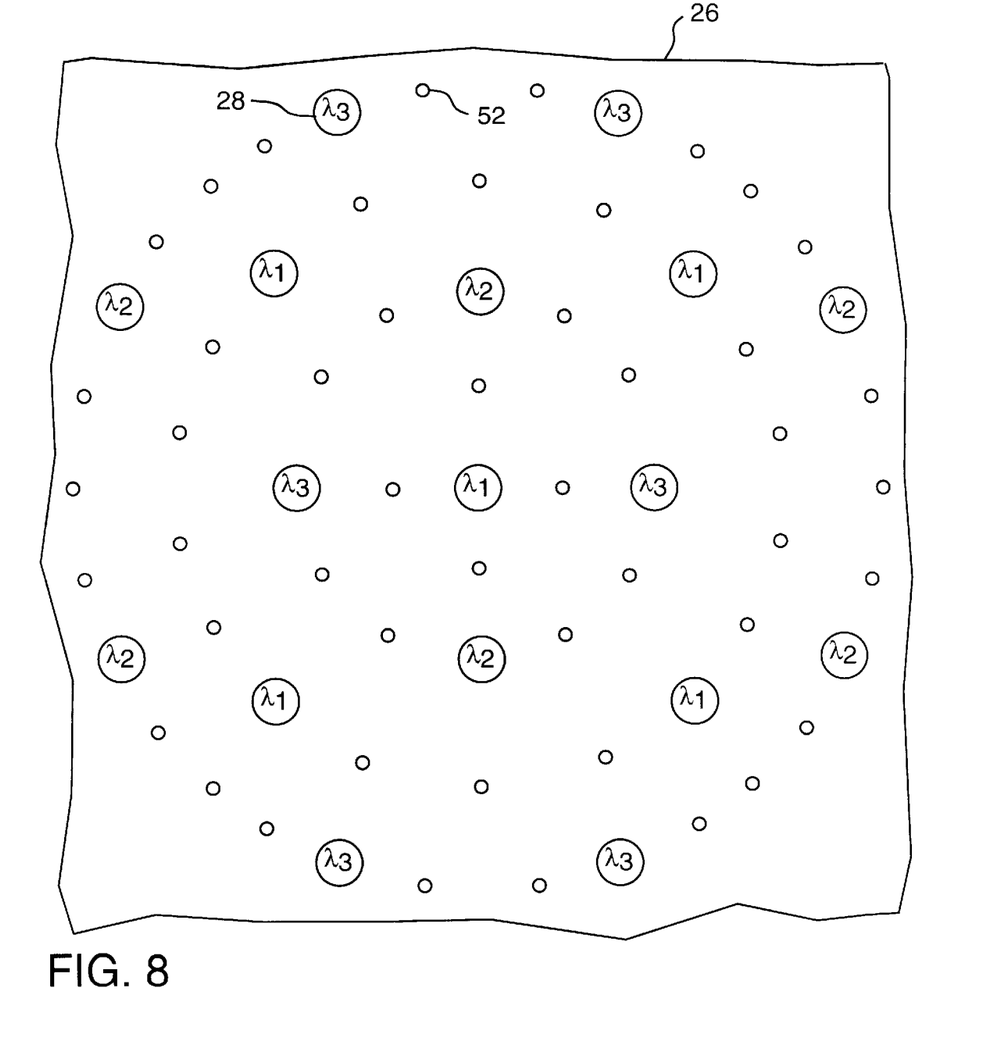
FIG. 8 is a bottom plan view of a portion of a showerhead constructed according to the present invention showing the distribution of light sources having different peak frequencies.

FIG. 8 shows a preferred distribution of light sources 28 in a three wavelength system. The light sources 28 are designated by their peak wavelengths $\lambda_1$, $\lambda_2$, and $\lambda_3$. Because a uniform distribution of all wavelengths is desired, the lamps $\lambda_1$, $\lambda_2$, and $\lambda_3$ are evenly distributed throughout the showerhead 26. Obviously, there are many more combinations of lamps which will realize the benefits of the present invention. Alternatively, a particular wavelength may be concentrated at the center or edge of the wafer to create a desired result. For example, wavelengths which exhibit generally higher absorptivity may be concentrated around the edges to compensate for the lower temperate caused by edge cooling.

Although a single light bulb usually contains only one "light source", with only one peak wavelength, more than one "light source" may be combined in a single bulb, for example, by providing more than one filament, or a single filament generating multiple wavelength peaks, so that multiple peak wavelengths of energy may originate from the same bulb. Such a bulb eliminates the need to evenly distribute the lights sources so as to evenly mix the peak wavelengths.

Those of ordinary skill in the art will recognize that many more modifications and variations of the present invention may be implemented. Likewise, at least some of the benefits of the present invention can be realized by having the light sources 28 below the wafer 16. In addition, other types of energy sources may be used to heat the wafer 16. Furthermore, the invention may be used in the fabrication of devices other than semiconductor wafers, such as flat panel displays. The foregoing description and the following claims are intended to cover all such modifications and variations.

What is claimed is:

1. A method for heating a film having a thickness and a known composition, comprising:

selecting a plurality of radiant energy sources each having an intensity and a different peak energy wavelength, for producing radiant energy having a predetermined absorptivity profile based on the thickness of the film and the composition of the film;

radiating the radiant energy from the sources; and directing the radiant energy toward the film.

2. The method of claim 1, wherein selecting a plurality of radiant energy sources is selected from the group consisting of selecting a plurality of light energy sources, selecting a plurality of RF energy sources, and selecting a plurality of microwave energy sources.

3. The method of claim 1, wherein the film includes a first portion having a first thickness and a second portion having a second thickness, and wherein selecting a plurality of radiant energy sources includes selecting a plurality of radiant energy sources for producing radiant energy having the predetermined absorptivity profile when the first thickness does not equal the second thickness.

4. The method of claim 1, further comprising:

changing the thickness of the film over time; and adjusting the intensity of certain of the plurality of radiant energy sources for producing radiant energy having the predetermined absorptivity profile as the thickness of the film changes.

5. The method of claim 1, wherein selecting a plurality of radiant energy sources includes selecting a plurality of radiant energy sources for producing radiant energy having a constant absorptivity profile based on the thickness and the composition of the film.

6. A method for heating a film having a thickness and a known composition, the film including a first portion with a first thickness and a second portion with a second thickness, comprising:

selecting a plurality of radiant energy sources each having a different peak energy wavelength, for producing radiant energy having a predetermined absorptivity profile based on the thickness and the composition of the film where the first thickness does not equal the second thickness;

radiating the radiant energy from the sources; and directing the radiant energy toward the film.

7. The method of claim 6, wherein selecting a plurality of radiant energy sources includes selecting a plurality of radiant energy sources for producing radiant energy having an absorptivity profile that increases as the thickness of the film decreases.

8. A method for heating a film having a thickness and a known composition, comprising:

selecting a plurality of radiant energy sources each having an intensity and a different peak energy wavelength, for producing radiant energy having a predetermined absorptivity profile based on the thickness of the film and the composition of the film;

radiating the radiant energy from the sources;

directing the radiant energy toward the film;

changing the thickness of the film over time; and adjusting the intensity of certain of the plurality of radiant energy sources for producing radiant energy having the predetermined absorptivity profile as the thickness of the film changes.

9. The method of claim 8, wherein selecting a plurality of radiant energy sources includes selecting a plurality of radiant energy sources for producing radiant energy having an absorptivity profile that increases as the thickness of the film decreases.

* * * * *

UNITED STATES PATENT AND TRADEMARK OFFICE
CERTIFICATE OF CORRECTION

PATENT NO.    : 6,043,450
DATED         : March 28, 2000
INVENTOR(S)   : Sandhu

It is certified that error appears in the above-identified patent and that said Letters Patent is hereby corrected as shown below:

<u>Column 4,</u>
Line 66, after the words "vacuum system", please delete the reference numeral "3.6" and insert the reference numeral -- 36 -- therefor.

Signed and Sealed this

Thirtieth Day of October, 2001

*Attest:*

NICHOLAS P. GODICI
*Attesting Officer*   Acting Director of the United States Patent and Trademark Office